United States Patent
Tjandra et al.

(10) Patent No.: US 10,260,149 B2
(45) Date of Patent: Apr. 16, 2019

(54) SIDE INJECT NOZZLE DESIGN FOR PROCESSING CHAMBER

(71) Applicant: Applied Materials, Inc., Santa Clara, CA (US)

(72) Inventors: Agus Sofian Tjandra, San Jose, CA (US); Martin John Ripley, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/466,962

(22) Filed: Mar. 23, 2017

(65) Prior Publication Data

US 2017/0314126 A1 Nov. 2, 2017

Related U.S. Application Data

(60) Provisional application No. 62/328,669, filed on Apr. 28, 2016.

(51) Int. Cl.
| | |
|---|---|
| *C23C 16/458* | (2006.01) |
| *C23C 16/455* | (2006.01) |
| *C23C 16/46* | (2006.01) |
| *H01L 21/67* | (2006.01) |

(52) U.S. Cl.
CPC .... *C23C 16/4584* (2013.01); *C23C 16/45502* (2013.01); *C23C 16/45563* (2013.01); *C23C 16/46* (2013.01); *H01L 21/67115* (2013.01)

(58) Field of Classification Search
CPC .............................................. C23C 16/45563
See application file for complete search history.

(56) References Cited

U.S. PATENT DOCUMENTS

| | | | |
|---|---|---|---|
| 6,291,800 B1 * | 9/2001 | Shirakawa | G03F 7/168 118/724 |
| 8,056,500 B2 | 11/2011 | Tseng et al. | |
| 8,608,853 B2 | 12/2013 | Tseng et al. | |
| 8,652,296 B2 | 2/2014 | Kim et al. | |
| 8,821,742 B2 | 9/2014 | Yoshida et al. | |
| 8,888,916 B2 | 11/2014 | Tseng et al. | |
| 8,980,767 B2 | 3/2015 | Rogers et al. | |
| 9,123,758 B2 | 9/2015 | Tjandra et al. | |
| 2013/0125819 A1 | 5/2013 | Borean et al. | |

(Continued)

*Primary Examiner* — Joseph A Miller, Jr.
(74) *Attorney, Agent, or Firm* — Patterson + Sheridan LLP (57) ABSTRACT

Implementations of the present disclosure provide apparatus and method for improving gas distribution during thermal processing. One implementation of the present disclosure provides an apparatus for processing a substrate comprising a chamber body defining a processing volume, a substrate support disposed in the processing volume, wherein the substrate support has a substrate supporting surface, a gas source assembly coupled to an inlet of the chamber body, an exhaust assembly coupled to an outlet of the chamber body, and a side gas assembly coupled to a sidewall of the chamber body, wherein the side gas assembly comprises a gas inlet pointed in a direction that is tangential to the edge of the substrate supporting surface, and wherein the gas inlet, the inlet of the chamber body, and the outlet of the chamber body are angularly offset at about 90° with respect to each other, and the gas inlet, the inlet of the chamber body, and the outlet of the chamber body are intersected by a common plane.

8 Claims, 5 Drawing Sheets

(56) References Cited

U.S. PATENT DOCUMENTS

2013/0199441 A1* 8/2013 Arena .................. C30B 25/14
  117/102
2016/0097126 A1 4/2016 Kogura et al.

* cited by examiner

SIDE INJECT NOZZLE DESIGN FOR PROCESSING CHAMBER

CROSS-REFERENCE TO RELATED APPLICATIONS

This application claims priority to U.S. provisional patent application Ser. No. 62/328,669, filed Apr. 28, 2016, which is herein incorporated by reference.

BACKGROUND

Field

The present disclosure relates generally to a semiconductor processing tool and, more specifically, to a reactor with improved gas flow distribution.

Description of the Related Art

Semiconductor substrates are processed for a wide variety of applications, including the fabrication of integrated devices and microdevices. One method of processing substrates includes growing an oxide layer on an upper surface of the substrate within a processing chamber. The oxide layer may be deposited by exposing the substrate to oxygen and hydrogen gases while heating the substrate with a radiant heat source. The oxygen radicals strike the surface of the substrate to form a layer, for example a silicon dioxide layer, on a silicon substrate.

Current processing chamber used for radical oxygen growth have limited growth control, resulting in poor processing uniformity. For example, low processing chamber pressure requirements for radial oxygen growth and current gas inlet designs result in gas reaching the substrate at a high velocity. The high velocity of the gas causes impingement on the substrate and prevents the gas from being adequately heated at the edge of the substrate. On the other hand, oxygen radicals generated from combustion quickly recombine to create a short life cycle for the oxygen radicals. Therefore, the limited growth control due to the high velocity of the gas combined with the short life cycle of oxygen radicals results in greater growth at the center of the substrate, and poor growth at the edges of the substrate.

Therefore, there is a need for an improved gas flow distribution that provides growth control for more uniform film growth throughout the substrate, i.e., from the center to the edge.

SUMMARY

Implementations of the present disclosure provide apparatus and method for improving gas distribution during thermal processing. One implementation of the present disclosure provides an apparatus for processing a substrate comprising a chamber body defining a processing volume, a substrate support disposed in the processing volume, wherein the substrate support has a substrate supporting surface, a gas source assembly coupled to an inlet of the chamber body, an exhaust assembly coupled to an outlet of the chamber body, and a side gas assembly coupled to a sidewall of the chamber body, wherein the side gas assembly comprises a gas inlet pointed in a direction that is tangential to the edge of the substrate supporting surface, and wherein the gas inlet, the inlet of the chamber body, and the outlet of the chamber body are angularly offset at about 90° with respect to each other, and the gas inlet, the inlet of the chamber body, and the outlet of the chamber body are intersected by a common plane.

Another implementation of the present disclosure provides an apparatus for processing a substrate comprising a base ring having sidewalls defining a processing volume, wherein the base ring has an inlet and an outlet formed through the sidewalls, the inlet and the outlet are formed on opposite sides of the base ring, a substrate support disposed in the processing volume, wherein the substrate support has a substrate supporting surface, a heat source positioned to provide thermal energy to the processing volume, an exhaust assembly coupled to the outlet of the base ring, and a side gas assembly coupled to a side port of the base ring, wherein the side gas assembly comprises a gas inlet pointing to a tangent of the substrate supporting surface, and the side port, the inlet, and the outlet of the base ring are substantially disposed at the same elevation.

Yet another implementation of the present disclosure provides a method for processing a substrate comprising providing a process chamber defining a processing volume, wherein the process chamber has an inlet port and an exhaust port formed on opposite sides of the process chamber, positioning a substrate in the processing volume, providing a first gas flow from the inlet port to the outlet port, pumping the processing volume using an exhaust assembly coupled to the outlet port, and providing a second gas flow from a side port of the process chamber in a direction that is tangential to an edge of the substrate so that the majority of the second gas flows along a flow path towards the outlet.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Figure 1A:
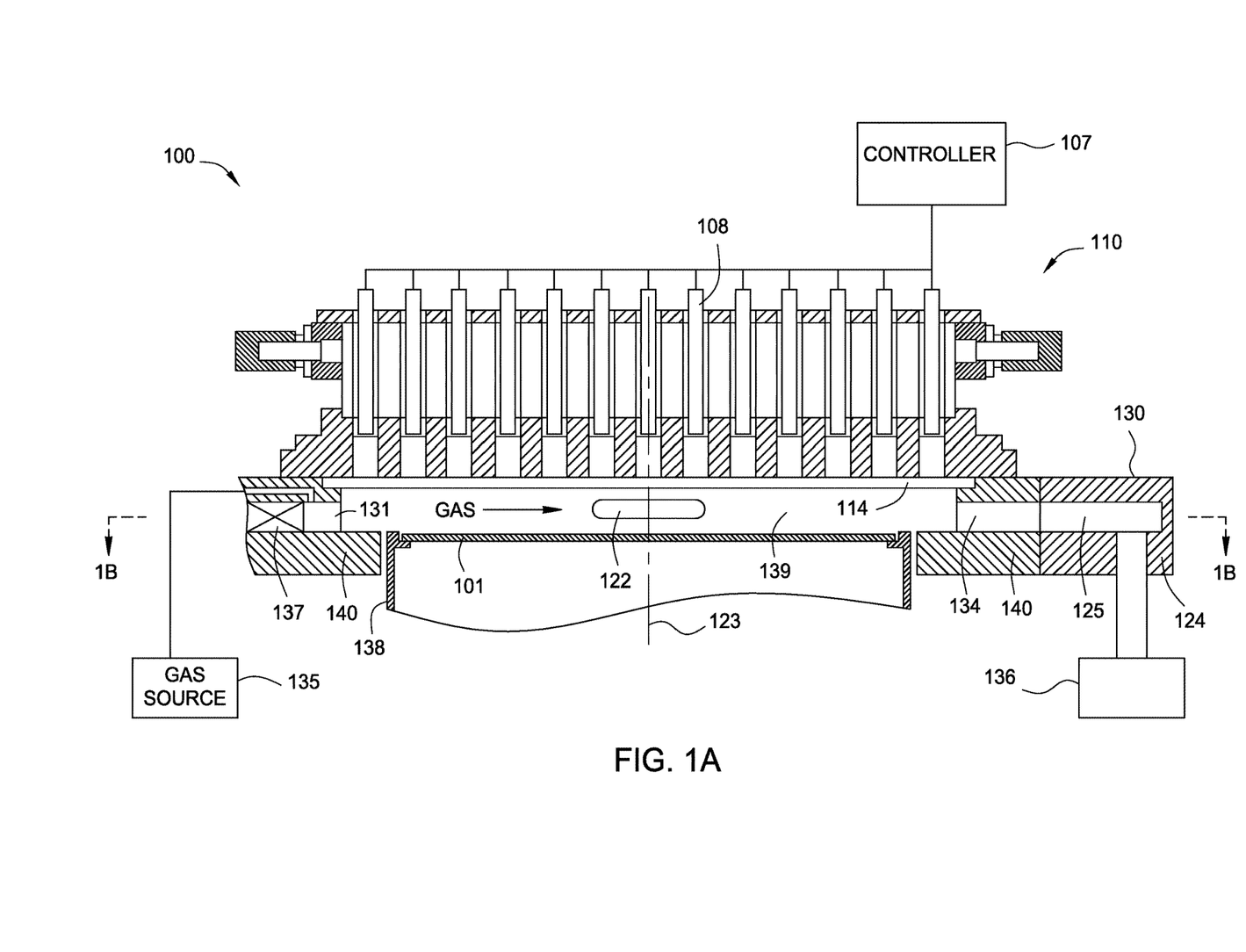
FIG. 1A is a schematic, cross-sectional representation of a thermal processing chamber that may be used to practice implementations of the present disclosure.

FIG. 1A is a schematic, cross-sectional representation of a thermal processing chamber 100 that may be used to practice implementations of the present disclosure. The thermal processing chamber 100 generally includes a lamp assembly 110, a chamber assembly 130 defining a processing volume 139, and a substrate support 138 disposed in the processing volume 139. The processing unit 124 is capable of providing a controlled thermal cycle that heats a substrate 104 for processes such as, for example, thermal annealing, thermal cleaning, thermal chemical vapor deposition, thermal oxidation and thermal nitridation, etc.

The lamp assembly 110 may be positioned relatively above the substrate support 138 to supply heat to the processing volume 139 via a quartz window 114. The quartz window 114 is disposed between the substrate 104 and the lamp assembly 110. The lamp assembly 110 may additionally or alternatively be disposed relatively below the substrate support 138 in some implementations. It is noted that the term "above" or "below" as used in this disclosure are not referring to absolute directions. The lamp assembly 110 is configured to house a heating source 108, such as a plurality of tungsten-halogen lamps for providing a tailored infrared heating means to a substrate 101 disposed on the substrate support 138. The plurality of tungsten-halogen lamps may be disposed in a hexagonal arrangement. The heating source 108 may be connected to a controller 107 which may control the energy level of the heating source 108 to achieve a uniform or tailored heating profile to the substrate 101. In one example, the heating source 108 is capable of rapidly heating the substrate 101 at a rate of from about 50° C./s to about 280° C./s.

The substrate 101 may be heated to a temperature ranging from about 550 degrees Celsius to about less than 700 degrees Celsius. The heating source 108 may provide zoned heating (temperature tuning) of the substrate 101. Temperature tuning may be performed to change the temperature of the substrate 101 at certain locations while not affecting the rest of the substrate temperature. In one implementation, the center of the substrate 101 is heated to a temperature that is 10 degrees Celsius to about 50 degrees Celsius higher than the temperature of the edge of the substrate 101.

A silt valve 137 may be disposed on the base ring 140 for a robot to transfer the substrate 101 into and out of the processing volume 139. The substrate 101 may be placed on the substrate support 138, which may be configured to move vertically and to rotate about a central axis 123. A gas inlet 131 may be disposed over the base ring 140 and connected to a gas source 135 to provide one or more processing gases to the processing volume 139. A gas outlet 134, formed on an opposite side of the base ring 140 from the gas inlet 131, is adapted to an exhaust assembly 124 which is in fluid communication with a pump system 136. The exhaust assembly 124 defines an exhaust volume 125, which is in fluid communication with the processing volume 139 via the gas outlet 134.

In one implementation, one or more side ports 122 may be formed over the base ring 140 between the gas inlet 131 and the gas outlet 134. The side port 122, the gas inlet 131, and the gas outlet 134 may be disposed at substantially the same level or elevation. That is, the side port 122, the gas inlet 131, and the gas outlet 134 may be intersected by a common plane. As will be discussed in more detail below, the side ports 122 is connected to a side gas source configured to improve gas distribution uniformity near edge areas of the substrate 101.

Figure 1B:
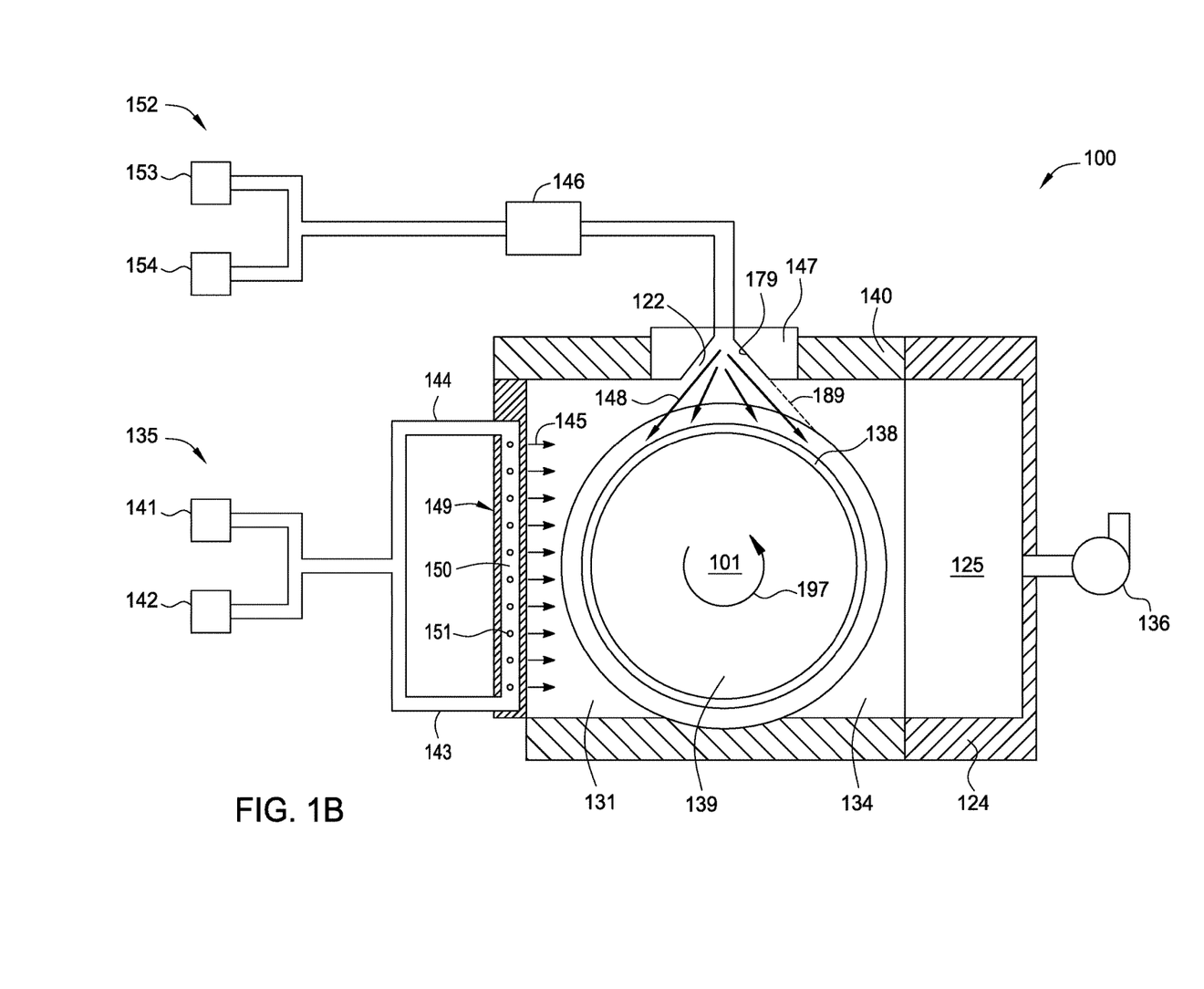
FIG. 1B is a schematic cross-sectional top view of the thermal processing chamber according to one implementation of the present disclosure.

FIG. 1B is a schematic cross-sectional top view of the thermal processing chamber 100 according to one implementation of the present disclosure. As shown in FIG. 1B, the gas inlet 131 and gas outlet 134 are disposed on opposite sides of the processing volume 139. Both of the gas inlet 131 and the gas outlet 134 may have a linear or azimuthal width which approximately equals to a diameter of the substrate support 138.

In one implementation, the gas source 135 may comprise multiple gas sources, for example a first gas source 141, and a second gas source 142, each configured to provide a processing gas. During operation, processing gases from the first gas source 141 and the second gas source 142 may mix together prior to entering an injection cartridge 149 disposed at the inlet 131. Alternatively, the processing gas from the second gas source 142 may be introduced to the injection cartridge 149 after the processing gas from the first gas source 141 has been introduced to the injection cartridge 149. The first gas source 141 may provide a gas that has a lower thermal conductivity and thus controls the combustion reaction.

In one implementation, the first gas source 141 provides an oxygen containing gas, such as oxygen gas, and the second gas source 142 provides a hydrogen containing gas, such as hydrogen gas. The second gas source 142 may also provide oxygen, nitrogen, or a mixture thereof. The gas from the first gas source 141 may be heated to a first temperature prior to entering the injection cartridge 149. The first temperature may be about 300° C. to about 650° C., for example about 550° C. The gas from the second gas source 142 may be provided to the injection cartridge 149 at room temperature. Alternatively, both the gas from the first gas source 141 and the gas from the second gas source 142 may be provided to the injection cartridge 149 at room temperature.

In one implementation, the injection cartridge 149 has an elongated channel 150 formed therein and two inlets 143, 144 formed on opposite ends of the elongated channel 150. A plurality of injecting holes 151 are evenly distributed along the elongated channel 150 and are configured to inject a main gas flow 145 towards the processing volume 139. The two-inlet design of the cartridge 149 improves uniformity among the gas flow from each of the plurality of injecting holes 151. The main gas flow 145 may include 30 to 50 percent hydrogen gas by volume and 50 to 70 percent oxygen gas by volume, and have a flow rate ranging from about 20 standard liters per minute (slm) to about 50 slm. The flow rate is based on the substrate 101 having a 300 mm diameter, which leads to a flow rate ranging from about 0.028 slm/cm$^2$ to about 0.071 slm/cm$^2$.

Under the vacuum force from the pump system 136, the main gas flow 145 is directed from the gas inlet 131 towards the gas outlet 134. In one implementation, the exhaust volume 125 of the exhaust assembly 124 is configured to extend the processing volume 139 to reduce the geometry influence of the chamber structure to the main gas flow 145. Particularly, the exhaust volume 125 is configured to extend the processing volume 139 along the direction of the main gas flow 145. The exhaust volume 125 may improve the uniformity of the main gas flow 145 across the processing volume 139 from the inlet 131 to the outlet 134. The pump system 136 may be also used to control the pressure of the processing volume 139. In one implementation, the pressure inside the processing volume ranges from about 1 Torr to about 19 Torr, such as between about 5 Torr to about 15 Torr.

In one implementation, a side injection assembly 147 is coupled to the base ring 140 so that a gas is flowed along a side gas flow 148 to the processing volume 139 via the side port 122. The side injection assembly 147, the injection cartridge 149, and the exhaust assembly 124 are angularly offset at about 90° with respect to each other. For example, the side injection assembly 147 may be located on a side of the base ring 140 between the injection cartridge 149 and the exhaust assembly 124, with the injection cartridge 149 and the exhaust assembly 124 disposed at opposing ends of the base ring 140. The side injection assembly 147, the injection cartridge 149, and the exhaust assembly 124 may be intersected by a common plane. In one implementation, the side injection assembly 147, the injection cartridge 149, and the exhaust assembly 124 are aligned to each other and disposed at substantially the same level.

The side injection assembly 147 is in fluid communication with a gas source 152 via a flow adjusting device 146 configured to control a flow rate of the side gas flow 148. The gas source 152 may include one or more gas sources. In one implementation, the gas source 152 is a single gas source that provides a hydrogen containing gas, such as hydrogen gas. In one implementation, the gas source 152 is a single gas source that provides an oxygen containing gas, such as oxygen gas. In one implementation, the gas source 152 is a single gas source that provides a mixed gas of a hydrogen containing gas, such as hydrogen gas, and an oxygen containing gas, such as oxygen gas. In another implementation, the gas source 152 is, or coupled to a remote radical source that generate radicals to the side port 122.

In one example, the gas source 152 is a remote plasma source (RPS) that produces hydrogen radicals to the side port 122. For a process that heats the substrate with lamps and injects hydrogen and oxygen into the processing chamber 100 from the slit valve 137, the side injection assembly 147 is configured to inject the hydrogen radicals into the processing volume 139. The hydrogen radicals introduced from the side injection assembly 147 improve the reaction rate along the edge of the substrate 101, leading to an oxide layer having improved thickness uniformity. The side gas flow 148 may have a flow rate ranging from about 5 slm to about 25 slm. For a substrate with a 300 mm diameter, the flow rate ranges from about 0.007 slm/cm$^2$ to about 0.035 slm/cm$^2$.

In some alternative implementations, the gas source 152 may contain multiple gas sources, for example a first gas source 153, and a second gas source 154, each configured to provide a processing gas. The first gas source 153 and the second gas source 154 may be the same or different in chemical composition. The processing gases from the first gas source 153 and the second gas source 154 may be mixed together prior to entering the flow adjusting device 146. In one implementation, the side gas flow 148 may be independently controlled and may include the same gas components as the main gas flow 145. The composition and the flow rate of the side gas flow 148 are important factors in forming an oxide layer having improved thickness uniformity.

In the implementation shown in FIG. 1B, the side injection assembly 147 is a funnel-shaped structure which spreads out towards the processing volume 139. That is, the side port 122 has an inner diameter that increases gradually toward the substrate 101. The side injection assembly 147 is adapted to direct the majority of the side gas flow 148 to the edge of the substrate 101 in the shape of a hollow cone. The edge of the substrate 101 may refer to the peripheral region measuring from 0 mm to 15 mm, for example 10 mm, from the edge of the substrate 101. Since the funnel-shaped structure of the side injection assembly 147 spreads out the majority of the side gas flow 148 aiming at the edge of the substrate 101, the gas exposure of the substrate 101 is increased at or near the edge area. In one implementation, the inner surface 179 of the side injection assembly 147 is configured so that it extends along a direction 189 that is substantially tangential to the edge of the substrate 101, or substantially tangential to the edge of the substrate supporting surface of the substrate support 138.

In addition, since the substrate 101 is rotated along counter clockwise direction 197, the gas velocity of the majority of the side gas flow 148 coming in from the side injection assembly 147 may be slowed down by a factor of 5 or greater, for example a factor of 10, which results in greater growth at the edge of the substrate 101. The gas velocity of the side gas flow 148 may be adjusted through one or more of a flow rate of the side gas flow 148, a rotation speed of the substrate 101, and the spread out angle of the side injection assembly 147 so that the side gas flow 148 does not travel too fast that prevents the side gas flow 148 from being adequately reacted with the main gas flow 145, or too slow that the rotation of the substrate 101 may drag the side gas flow 148 away from the edge of the substrate 101 without being adequately reacted with the main gas flow 145. As a result, the thickness profile at the edges of the substrate is improved.

The side injection assembly 147 may be made of any suitable material such as quartz, quartz lined, ceramic, ceramic coated, aluminum, stainless steel, steel, or the like.

Although FIG. 1B show the substrate 101 is rotating along counter clockwise direction, the substrate 101 may be rotated along clockwise direction and also benefit from the side gas flow 148.

Figure 2A:
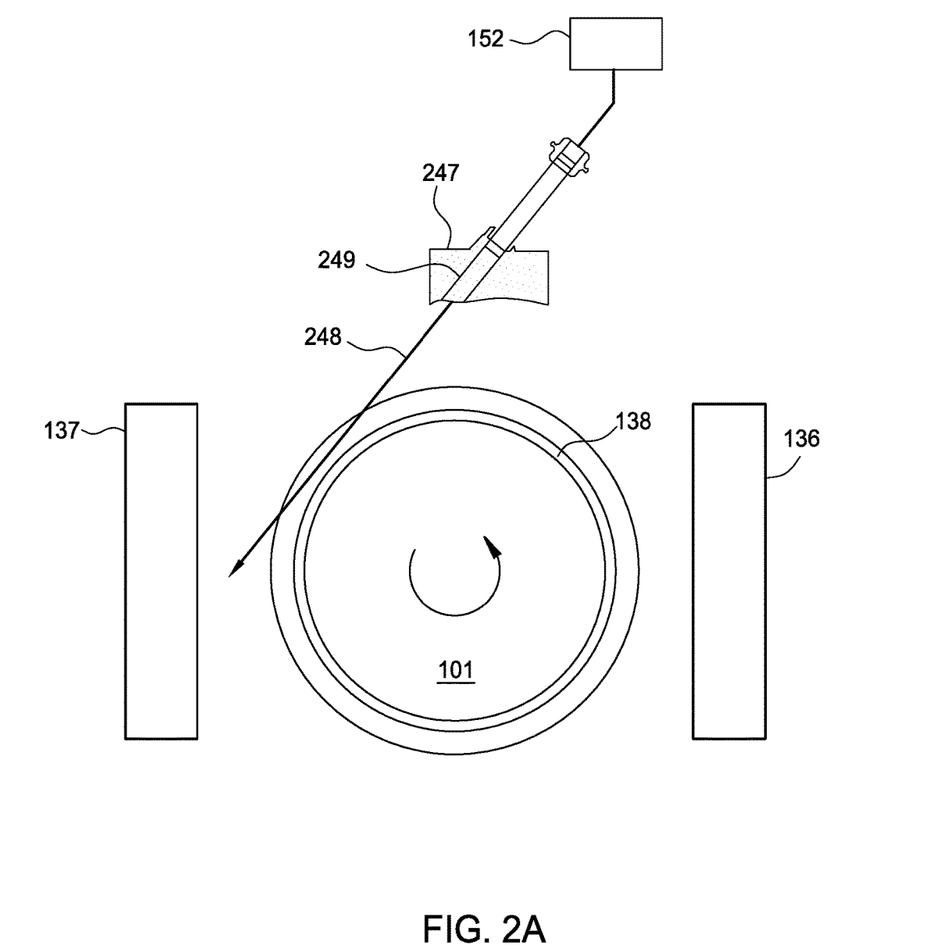
FIG. 2A is a schematic cross-sectional top view of a side injection assembly having an angled gas pipe according to one implementation of the present disclosure.

To further increase the effect of the side gas flow at the edge of the substrate 101, the side injection assembly 147 may be configured to have one or more gas inlets pointing to the edge of the substrate 101. FIG. 2A is a schematic cross-sectional top view of a side injection assembly 247 having an angled gas pipe according to one implementation of the present disclosure. The side injection assembly 247 may be used in place of the side injection assembly 147 shown in FIG. 1B. For sake of clarity, only the side injection assembly 247 and the substrate 101 are illustrated. However, it is contemplated that the side injection assembly 247 may be coupled to the base ring 140 between the gas inlet 131 and the gas outlet 134. The side port 122, the gas inlet 131, and the gas outlet 134 may be intersected by a common plane, as discussed above with respect to FIG. 1B.

In the implementation of FIG. 2A, the side injection assembly 247 is an elongated structure having a gas inlet 249 formed therein. The gas inlet 249 may be an elongated channel with any desired shape in cross-section, such as rectangular, square, round, polygonal, hexagonal, or any other suitable shape. The gas inlet 249 is angled to provide a side gas flow 248 to the processing volume 139 (FIG. 1B) via the side port 122 (FIG. 1B). The side gas flow 248 flows along a flow path that adjusts edge profile of the substrate 101 being processed. In one implementation, the gas inlet 249 is configured so that gas or gas of radicals, after existing the gas inlet 249, is flowing in a direction that is substantially tangential to the edge of the substrate 101, or substantially tangential to the edge of the substrate supporting surface of the substrate support 138. It is contemplated that the angle of the gas inlet 249 may be adjusted so that the side gas flow 248 is flowing towards the center of the substrate 101 (or substrate support 138), proximate the periphery of the substrate 101 (or substrate support 138), or spatially distributed on the substrate 101 (or substrate support 138) at any desired location.

The side injection assembly 247 may include a single gas inlet 249 as shown. Alternatively, the side injection assembly 247 may include a plurality of gas inlets. In such a case, the number of the gas inlets may be about 2 inlets to about 10 inlets, which may vary depending upon the size of the side injection assembly 247 and the size of the substrate to be processed. If multiple gas inlets are adapted, one or more gas inlets 249 may be configured to point upwardly towards the quartz window 114 (FIG. 1A) to limit or prevent unwanted growth or other reactions from occurring, while other gas inlets are pointed towards the edge of the substrate 101, or towards the edge of the substrate supporting surface of the substrate support 138. Alternatively, each of the plurality of gas inlets may be pointed to the same direction.

In some implementations, the angle of the gas inlet 249 is configured so that the side gas flow 248, either gas or gas of radicals, is flowing in a direction that is proximate the tangent of the substrate 101 or the substrate supporting surface of the substrate support 138. The term "proximate" described herein refers to a distance between the side gas flow 248 and the edge of the substrate 101. The distance may be within about 20 mm of the edge of the substrate 101, for example about 5 mm to about 10 mm. That is, a flow path of the gas or gas of radicals (i.e., the side gas flow 248) and a tangent line to the substrate 101 or the substrate supporting surface of the substrate support 138 parallel to the flow path of the gas or gas of radicals are about 5 mm to about 10 mm apart. Flowing of the gas or gas of radicals in a direction proximate the tangent line of the substrate has been observed to be able to incrementally raise the material concentration the along the edge of the substrate 101.

Regardless of whether the side gas flow 248 (either gas or gas of radicals) is flowed in a direction tangential to, or proximate the edge of the substrate 101 (or the edge of the substrate supporting surface of the substrate support 138), it has been observed that the gas or gas of radicals significantly promote the reaction rate along the edge of the substrate 101. For a process that heats the substrate with lamps and injects hydrogen and oxygen into the processing chamber 100 from the slit valve 137, the side injection assembly 247 is configured to provide a side gas flow 248 of hydrogen radicals. Providing hydrogen radicals at or near the edge of the substrate 101 activates the oxygen earlier at or near the edge of the substrate 101, leading to an oxide layer having improved thickness uniformity along the edge of the substrate 101.

In one exemplary implementation, the side injection assembly 247 is configured to have the gas inlet 249 pointed to the gas injection side of the processing chamber 100, e.g., the silt valve 137. That is, the gas inlet 249 is extended along a direction towards the gas injection side of the processing chamber. In this way, the majority of the gas flows along the side gas flow 248 towards the gas injection side of the processing chamber 100 and reacts with the processing gas(es) coming out of the injection cartridge 149 (FIG. 1B) at or near the edge of the substrate 101 (or the substrate supporting surface of the substrate support 138).

Figure 2B:
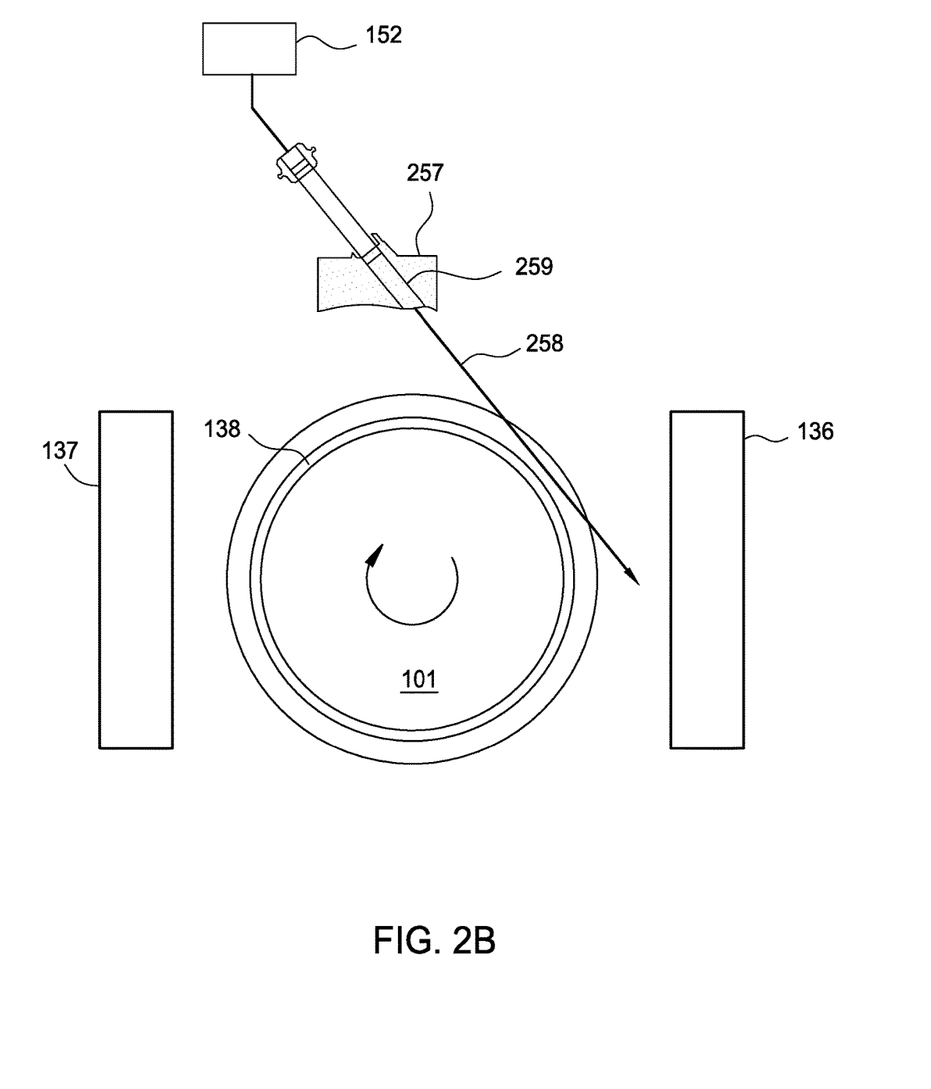
FIG. 2B a schematic cross-sectional top view of a side injection assembly having an angled gas pipe according to another implementation of the present disclosure.

FIG. 2B depicts another exemplary implementation where a side injection assembly 257 is configured to have the gas inlet 259 pointed to the gas exhaust side of the processing chamber 100, e.g., pump system 136. That is, the gas inlet 249 is extended along a direction towards the gas exhaust side of the processing chamber. In this way, the majority of the gas flows along the side gas flow 258 towards the gas exhaust side of the processing chamber 100 and reacts with the processing gas(es) coming from the injection cartridge 149 (FIG. 1B) at or near the edge of the substrate 101 (or the substrate supporting surface of the substrate support 138). It has been surprisingly observed that directing gas of hydrogen radicals towards the gas exhaust side will significantly increase the reaction with oxygen at or near the edge of the substrate in a process where oxygen and hydrogen are introduced into the processing chamber from the slit valve, leading to an oxide layer having improved thickness uniformity along the edge of the substrate.

Similarly, the side injection assembly 247 or 257 is in fluid communication with the gas source 152. Therefore, the side gas flow 248, 258 may be a hydrogen containing gas, such as hydrogen gas, or a gas of radicals, such as hydrogen radicals, as discussed above with respect to the side injection assembly 147. In either case, the side gas flow 248, 258 may have a flow rate ranging from about 5 slm to about 25 slm. The flow rate is based on the substrate 101 having a 300 mm diameter, which leads to a flow rate ranging from about 0.007 slm/cm$^2$ to about 0.035 slm/cm$^2$.

The gas inlets 249, 259 may have a diameter sized to provide the flow rate discussed above. For example, the gas inlets 249, 259 may have a diameter ranging between about 1 mm and about 2 cm, such as between about 5 mm and about 1 cm, for example about 7 mm. The diameter of the gas inlets 249, 259 may vary depending upon the desired gas flow rate of the gas or gas radicals needed for the application.

The side injection assembly 247, 257 may be made of any suitable material such as quartz, quartz lined, ceramic, ceramic coated, aluminum, stainless steel, steel, or the like.

Although FIGS. 2A and 2B show the substrate 101 is rotating along counter clockwise direction, the substrate 101 may be rotated along clockwise direction and also benefit from the side gas flow 248, 258.

Figure 3:
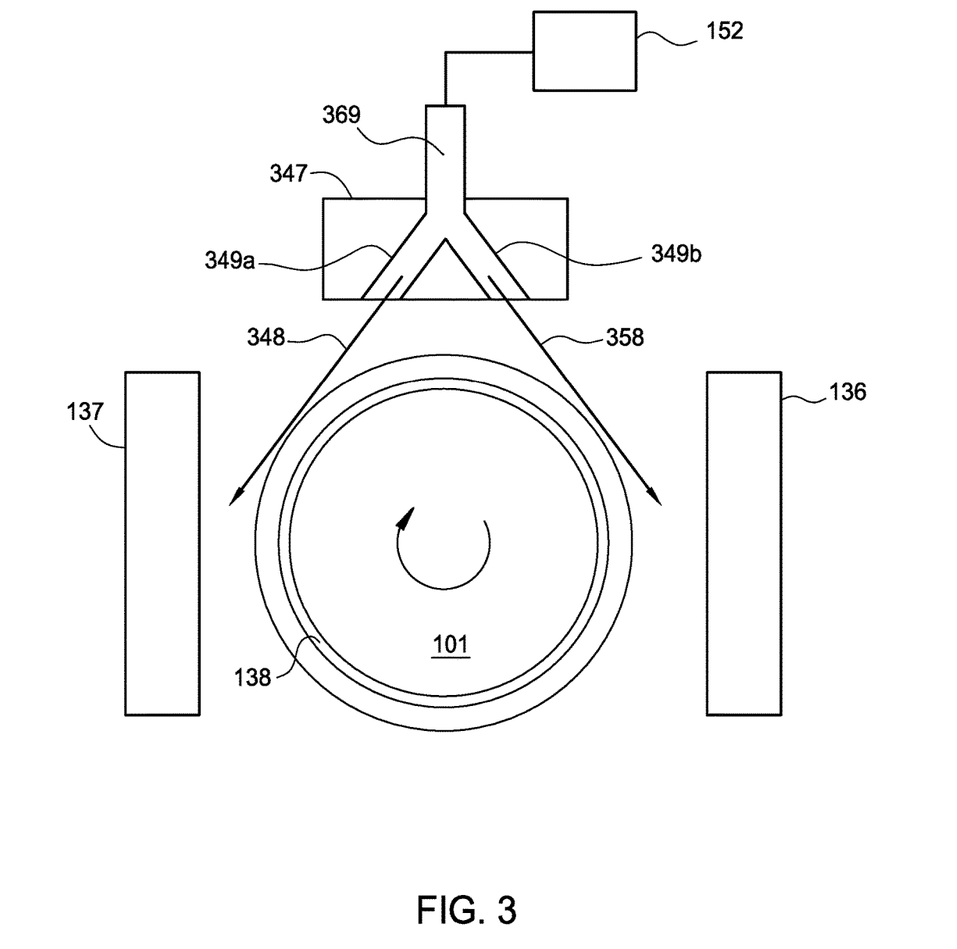
FIG. 3 is a schematic cross-sectional top view of a side injection assembly having a split-type gas pipe according to one implementation of the present disclosure.

FIG. 3 is a schematic cross-sectional top view of a side injection assembly 347 having a split-type gas pipe according to another implementation of the present disclosure. The side injection assembly 347 has a gas pipe 369 forked into two gas inlets 349a, 349b. The side injection assembly 347 functions similar to the side injection assembly 247, 257 to direct majority of gas or gas of radicals flowing along a side gas flow 348 and a side gas flow 358 towards the gas injection side of the processing chamber 100 (e.g., the silt valve 137) and the gas exhaust side of the processing chamber 100 (e.g., pump system 136), respectively. Additionally or alternatively, the gas inlets 349a and 349b may be configured so that the side gas flow 348 and the side gas flow 358 flow in a direction that is tangential to, or in a direction proximate the edge of the substrate 101 (or the edge of the substrate supporting surface of the substrate support 138.

Similarly, the side gas flow 348, 358 of gas or gas of radicals promote the reaction rate along the edge of the substrate 101. For a process that heats the substrate with lamps and injects hydrogen and oxygen into the processing chamber 100 from the slit valve 137, the side injection assembly 347 can be configured to provide side gas flow 348, 358 of hydrogen radicals. Providing hydrogen radicals at or near the edge of the substrate 101 activates the oxygen earlier at or near the edge of the substrate 101, leading to an oxide layer having improved thickness uniformity along the edge of the substrate 101.

Even though a thermal processing chamber is discussed in this application, implementations of the present disclosure may be used in any processing chamber where uniform gas flow is desired.

Benefits of the present disclosure include the use of an improved side gas assembly in a processing chamber to direct gas or gas of radicals towards the edge of the substrate to control growth uniformity throughout the substrate, i.e., from the center to the edge. The side gas assembly has an angled gas inlet configured to point to the gas injection side (e.g., slit valve) of the processing chamber and/or the gas exhaust side (e.g., pump system) of the processing chamber. Particularly, it has been surprisingly observed that directing gas of hydrogen radicals towards the gas exhaust side, by either flowing gas of hydrogen radicals in a directional tangential to, or proximate the edge of the substrate, will significantly increase the reaction with oxygen at or near the edge of the substrate in a process where oxygen and hydrogen are introduced into the processing chamber from the slit valve, thereby leading to an oxide layer having improved thickness uniformity along the edge of the substrate. As a result, the overall thickness uniformity of the substrate is improved.

While the foregoing is directed to implementations of the present disclosure, other and further implementations of the disclosure may be devised without departing from the basic scope thereof, and the scope thereof is determined by the claims that follow.

What is claimed is:

1. An apparatus, comprising:
a chamber body comprising a gas inlet disposed on a first side of the chamber body, a gas outlet disposed on a second side of the chamber body, the second side being opposite to the first side;
a substrate support disposed within the chamber body, wherein the substrate support has a substrate support surface;
an exhaust assembly coupled to the gas outlet of the chamber body; and
a side gas assembly disposed on a third side of the chamber body, the third side being located between the first side and the second side, wherein the side gas assembly comprises a gas channel angled and extended along a direction towards the gas outlet of the chamber body, and the gas channel is operable to provide a gas flow in a direction tangential to, or proximate an edge of the substrate supporting surface, wherein the gas inlet is in fluid communication with a first gas source, a second gas source, and a third gas source, the first gas source and the second gas source are different in chemical composition, and the third gas source is a remote plasma source.

2. The apparatus of claim 1, wherein the substrate support is operable to rotate along a clockwise or counter clockwise direction.

3. An apparatus for processing a substrate, comprising:
a chamber body defining a processing volume therein;
a substrate support disposed in the processing volume, wherein the substrate support has a substrate support surface;
a gas source assembly in fluid communication with an inlet of the chamber body, wherein the gas source assembly is in fluid communication with a first gas source and a second gas source, and the first gas source and the second gas source are different in chemical composition;
an exhaust assembly in fluid communication with an outlet of the chamber body, and
a side gas assembly coupled to a sidewall of the chamber body, wherein the sidewall is on a side different from the inlet and the outlet of the chamber body, and the side gas assembly comprises a gas channel that is angled and extended along a direction towards the outlet of the chamber body, and wherein the inlet of the chamber body and the outlet of the chamber body are intersected by a common plane.

4. The apparatus of claim 3, wherein the side gas assembly is in fluid communication with a third gas source that is different from the first gas source in chemical composition.

5. The apparatus of claim 4, wherein the first gas source comprises an oxygen containing gas, and each of the second and third gas sources comprises a hydrogen containing gas.

6. The apparatus of claim 5, wherein the hydrogen containing gas is hydrogen radicals.

7. The apparatus of claim 3, wherein the side gas assembly is in fluid communication with a third gas source, the third gas source comprises an oxygen containing gas or a gas mixture of a hydrogen containing gas and an oxygen containing gas.

8. The apparatus of claim 3, wherein the side gas assembly is operable to provide, from the gas channel, a gas flow along a flow path that is at a distance of about 5 mm to about 10 mm from a tangent line of the substrate supporting surface, and the tangent line is parallel to the flow path.

* * * * *